United States Patent
Ashmore, Jr.

(10) Patent No.: US 9,344,109 B2
(45) Date of Patent: *May 17, 2016

(54) METHOD, SYSTEM AND APPARATUS FOR DUAL MODE OPERATION OF A CONVERTER

(71) Applicant: Benjamin H. Ashmore, Jr., Austin, TX (US)

(72) Inventor: Benjamin H. Ashmore, Jr., Austin, TX (US)

(73) Assignee: Benjamin H. Ashmore, Jr., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/642,436

(22) Filed: Mar. 9, 2015

(65) Prior Publication Data

US 2015/0244392 A1 Aug. 27, 2015

Related U.S. Application Data

(63) Continuation of application No. 13/529,787, filed on Jun. 21, 2012, now Pat. No. 9,013,338, which is a continuation of application No. 13/099,665, filed on May 3, 2011, now Pat. No. 8,228,220, which is a (Continued)

(51) Int. Cl.
   *H03M 1/12* (2006.01)
   *H03M 3/00* (2006.01)

(52) U.S. Cl.
   CPC .............. *H03M 3/382* (2013.01); *H03M 3/43* (2013.01); *H03M 3/456* (2013.01); *H03M 3/39* (2013.01)

(58) Field of Classification Search
   CPC ... H03M 1/12; H03M 1/462; H03M 2201/11; H03M 2201/14; H03M 1/1071; H03M 2201/63; H03M 2201/6327; H03M 2201/657; H03M 3/458

USPC .................................. 341/118, 120, 143, 155
See application file for complete search history.

(56) References Cited

U.S. PATENT DOCUMENTS

| | | | |
|---|---|---|---|
| 4,053,926 A | | 10/1977 | Lemoine et al. |
| 4,058,808 A | * | 11/1977 | Malaviya ............ H03M 1/1019 324/111 |
| 4,112,428 A | * | 9/1978 | Dorsman ............... H03M 1/822 324/99 D |
| 4,118,698 A | * | 10/1978 | Becker .................... H03M 1/56 341/120 |
| 4,334,177 A | | 6/1982 | Lund |
| 4,340,883 A | | 7/1982 | Cook |

(Continued)

OTHER PUBLICATIONS

Office Action for U.S. Appl. No. 12/475,841, mailed Aug. 10, 2010, 14 pgs.

(Continued)

*Primary Examiner* — Linh Nguyen
(74) *Attorney, Agent, or Firm* — Sprinkle IP Law Group

(57) ABSTRACT

Methods, systems and apparatuses for operating a converter or other circuits are disclosed. More particularly, in one embodiment a converter or other circuit can be operated in two modes which may include the count-to-time and time-to-count modes to determine an output value corresponding to an input signal. During operation in the count-to-time mode a converter may be operated using a reference signal to determine a number of clock cycles needed until an output corresponds to a scaling factor is reached. During operation of the circuit in the time-to-count mode then, the converter may be operated for this number of clock cycles using the input signal to determine an output. This output may be proportional to the level on the input signal.

21 Claims, 17 Drawing Sheets

Related U.S. Application Data continuation of application No. 12/475,841, filed on Jun. 1, 2009, now Pat. No. 7,956,777, which is a continuation of application No. 12/047,817, filed on Mar. 13, 2008, now Pat. No. 7,551,109.

(60) Provisional application No. 60/906,934, filed on Mar. 14, 2007.

(56) References Cited

U.S. PATENT DOCUMENTS

| | | | |
|---|---|---|---|
| 4,371,868 A * | 2/1983 | Van de Grift | H03M 1/00 324/130 |
| 4,423,408 A | 12/1983 | Place | |
| 4,559,521 A * | 12/1985 | Yada | H03M 1/00 324/99 D |
| 4,565,992 A * | 1/1986 | Sakamoto | H03M 1/00 341/164 |
| 4,625,197 A | 11/1986 | Holmes | |
| 4,736,189 A | 4/1988 | Katsumata et al. | |
| 4,943,807 A | 7/1990 | Early et al. | |
| 5,092,330 A | 3/1992 | Duggan | |
| 5,262,780 A | 11/1993 | Gray | |
| 5,319,370 A | 6/1994 | Signore et al. | |
| 5,321,403 A | 6/1994 | Eng et al. | |
| 5,644,308 A | 7/1997 | Kerth et al. | |
| 6,147,631 A | 11/2000 | Maulik et al. | |
| 6,346,902 B1 | 2/2002 | Venes et al. | |
| 6,384,760 B1 * | 5/2002 | Fuhrman | H03M 1/1019 341/118 |
| 6,433,713 B1 | 8/2002 | Fuhrman | |
| 6,583,741 B1 * | 6/2003 | Knudsen | H03M 3/388 341/118 |
| 6,799,131 B1 | 9/2004 | Steiner et al. | |
| 6,833,803 B2 | 12/2004 | Mayfield | |
| 6,950,044 B1 | 9/2005 | Piasecki et al. | |
| 6,967,603 B1 | 11/2005 | Lin | |
| 7,068,205 B1 | 6/2006 | Hastings et al. | |
| 7,106,230 B2 | 9/2006 | Kushner et al. | |
| 7,161,523 B1 | 1/2007 | Zortea | |
| 7,224,298 B2 | 5/2007 | Lin | |
| 7,301,486 B2 | 11/2007 | Wang et al. | |
| 7,319,423 B2 | 1/2008 | Augusto et al. | |
| 7,551,109 B1 | 6/2009 | Ashmore, Jr. | |
| 7,623,053 B2 | 11/2009 | Terry et al. | |
| 7,956,777 B2 | 6/2011 | Ashmore, Jr. | |
| 8,228,220 B2 | 7/2012 | Ashmore, Jr. | |
| 9,013,338 B2 * | 4/2015 | Ashmore, Jr. | 341/120 |
| 2001/0045803 A1 | 11/2001 | Cencur | |
| 2007/0216556 A1 | 9/2007 | Rieubon et al. | |
| 2009/0313313 A1 | 12/2009 | Yokokawa et al. | |
| 2011/0205094 A1 | 8/2011 | Ashmore, Jr. | |
| 2013/0093608 A1 * | 4/2013 | Kim | H03M 9/00 341/100 |

OTHER PUBLICATIONS

Office Action for U.S. Appl. No. 12/475,841, mailed Dec. 8, 2010, 14 pgs.
Office Action for U.S. Appl. No. 13/099,665, mailed Jun. 15, 2011, 5 pgs.
Office Action for U.S. Appl. No. 13/099,665, mailed Jan. 5, 2012, 11 pgs.
Office Action for U.S. Appl. No. 13/529,787, mailed Apr. 11, 2014, 6 pgs.

* cited by examiner

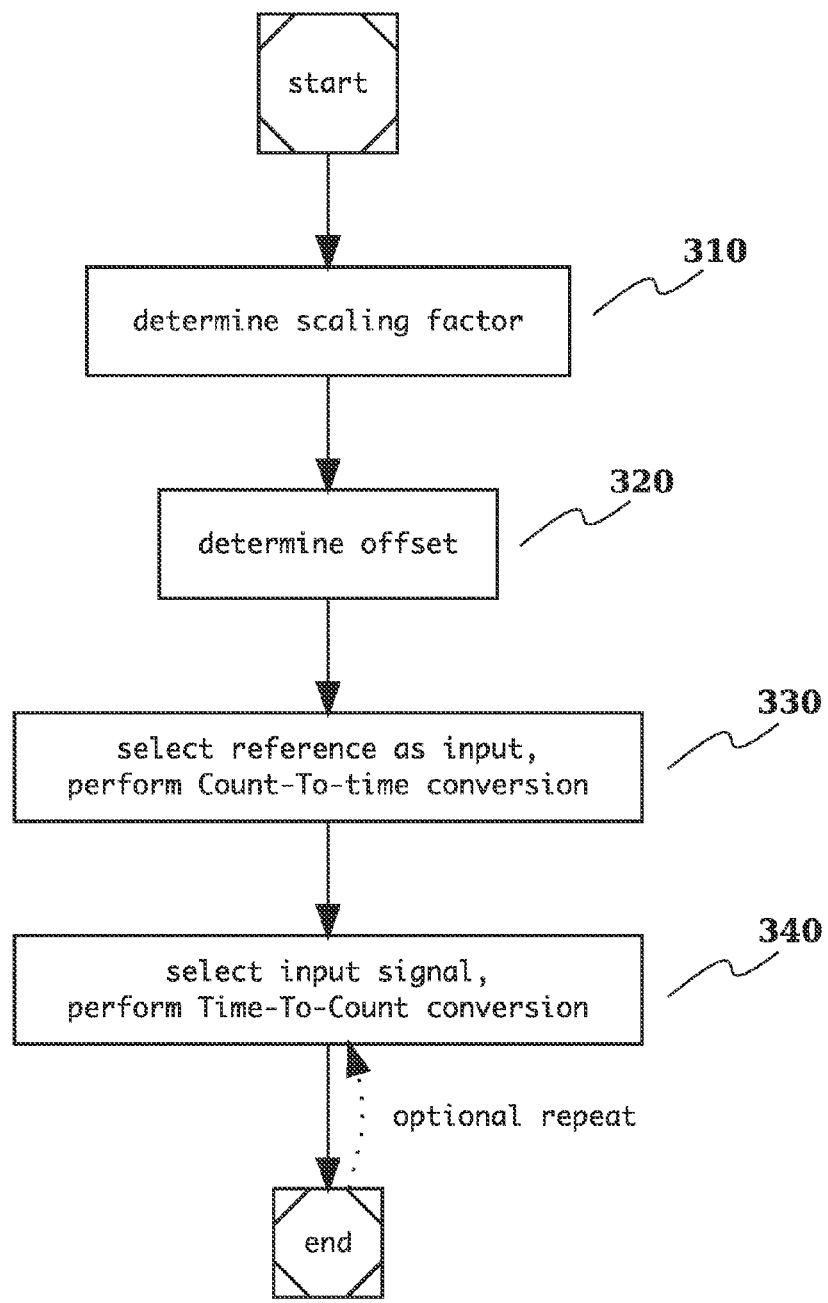
*Fig. 4 Dual Mode Converter Operation*

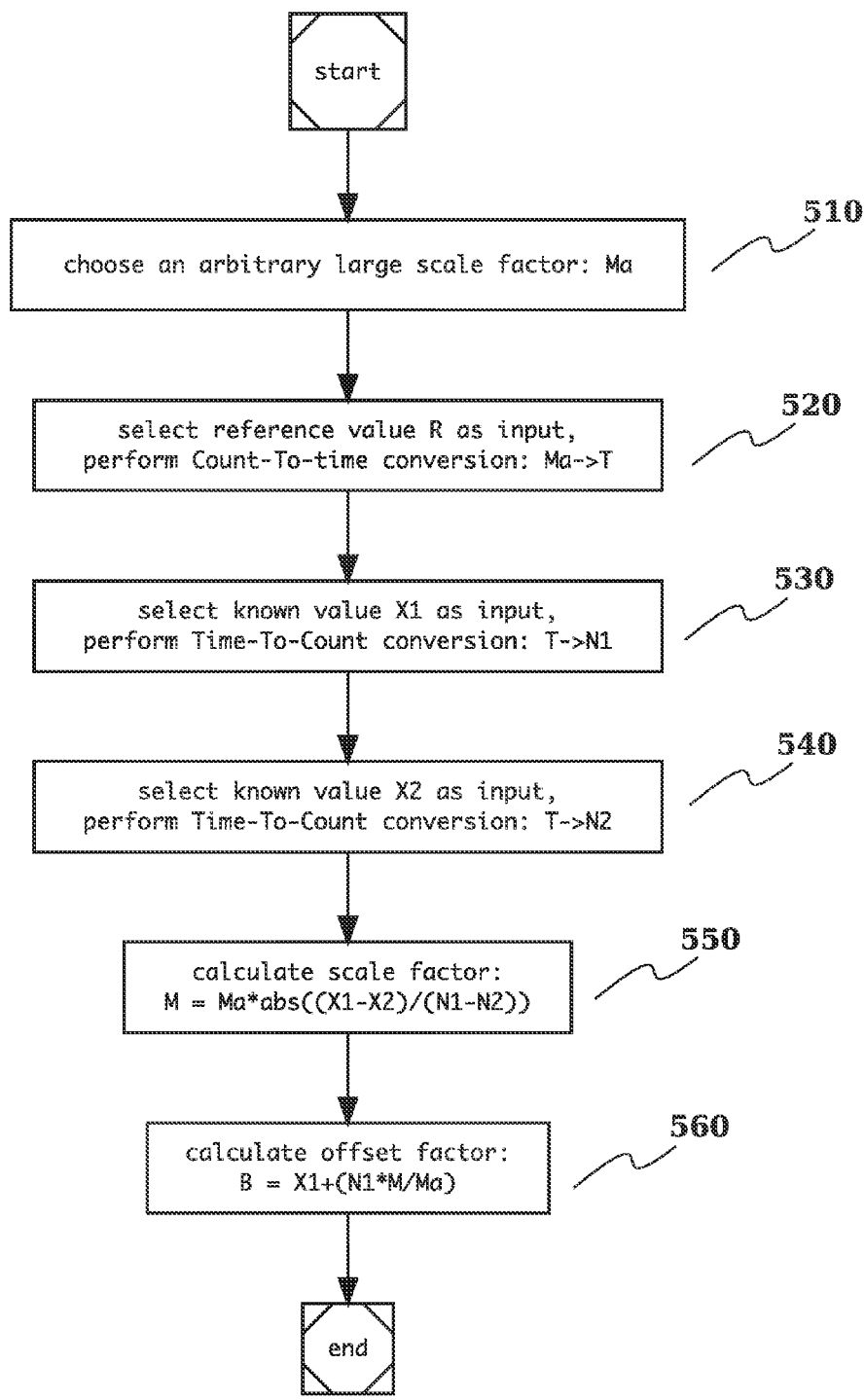
*Fig. 6A Dual Mode Converter Calibration*

*Fig. 6B  Calibration Count-To-Time*
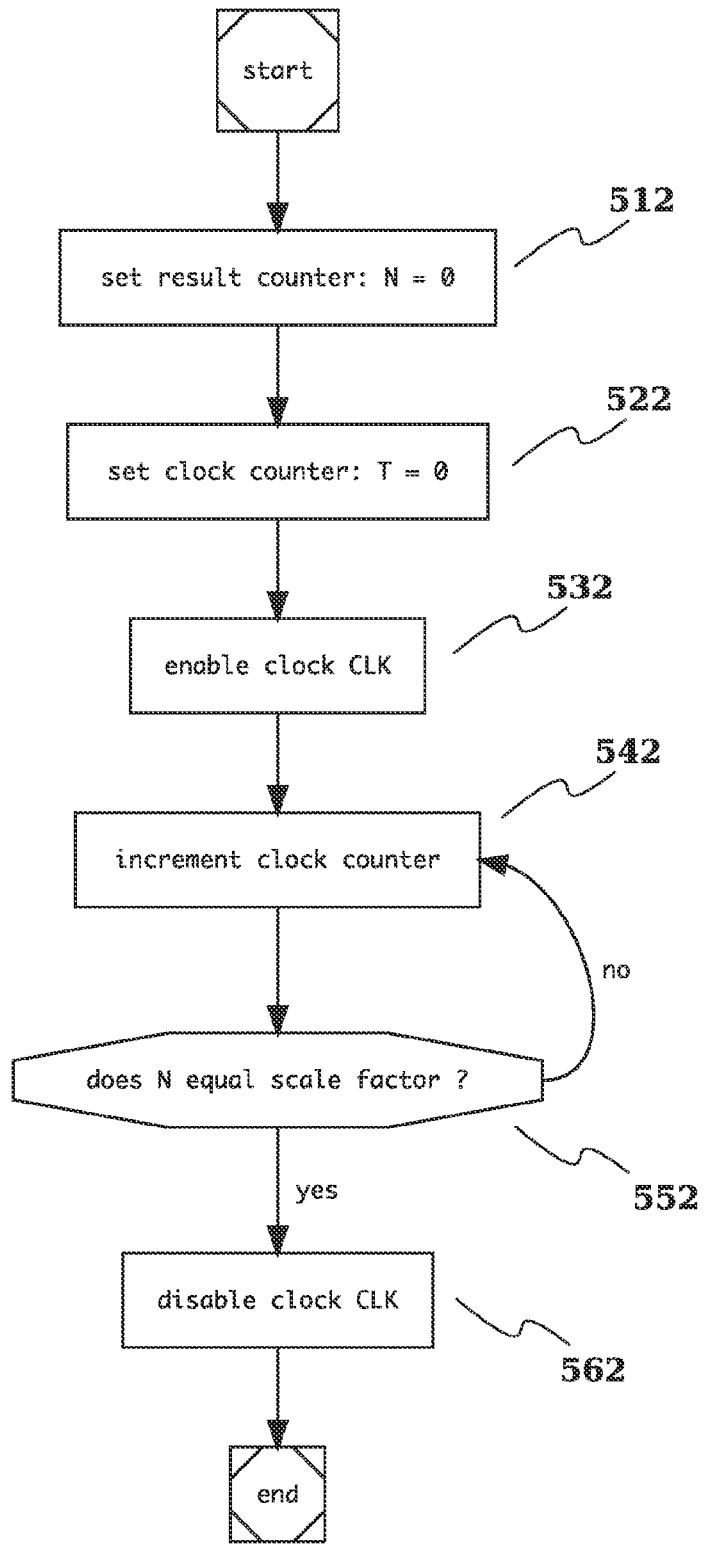

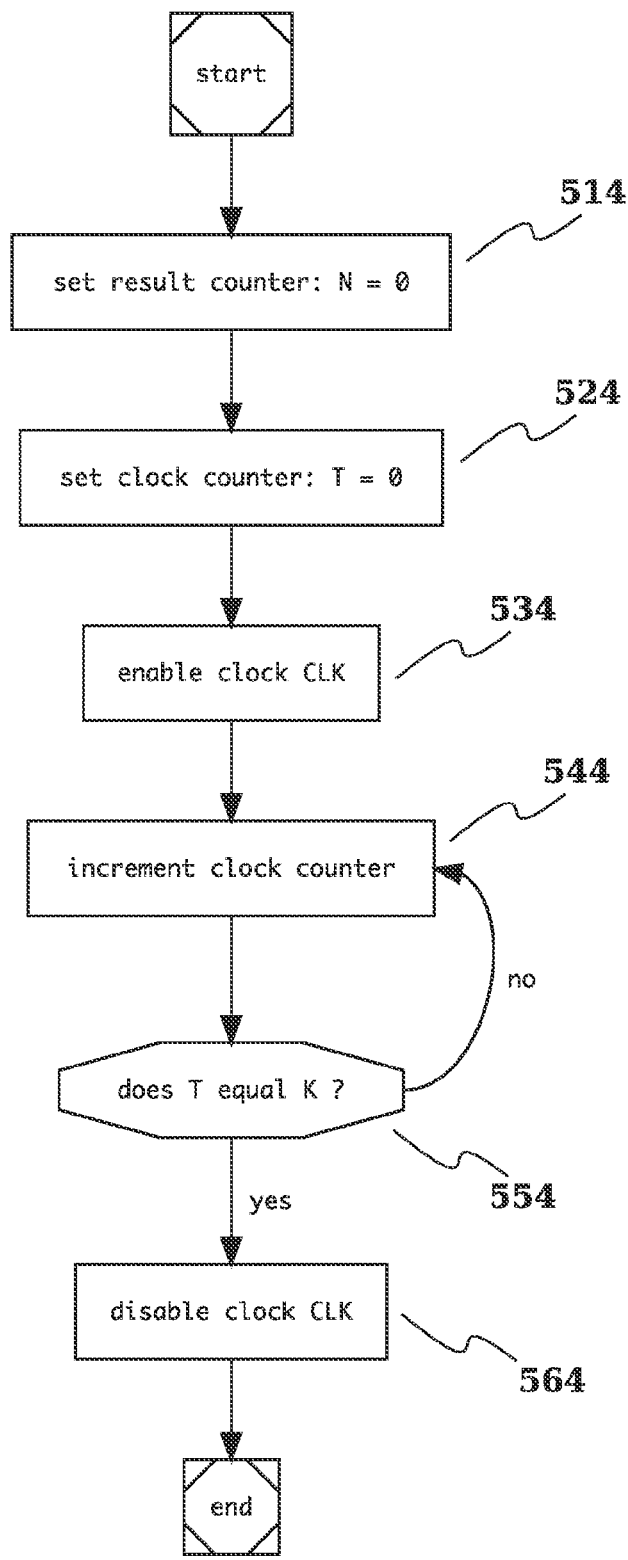
*Fig. 6C Calibration Time-To-Count*

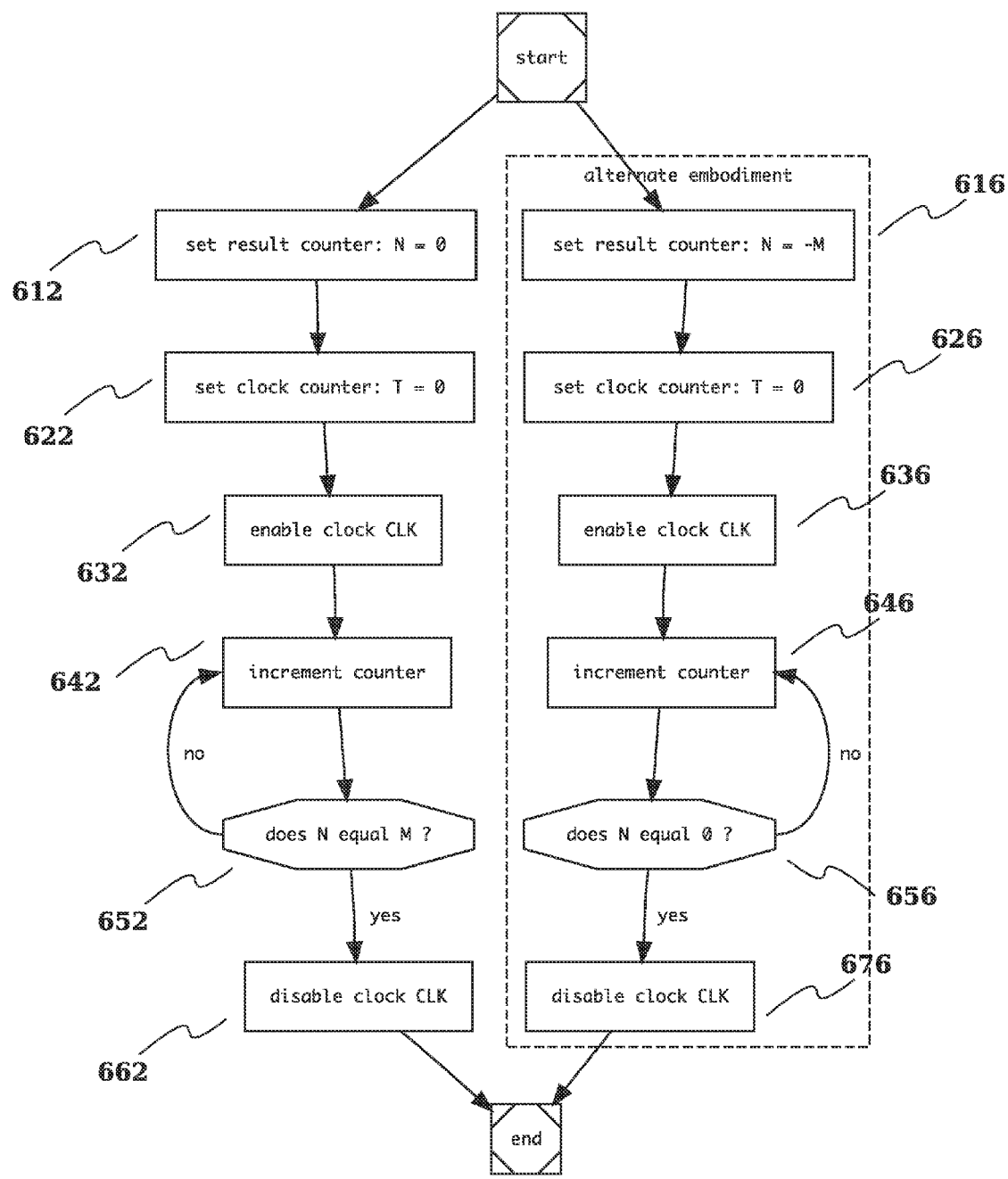
*Fig. 7  Count-To-Time Mode*

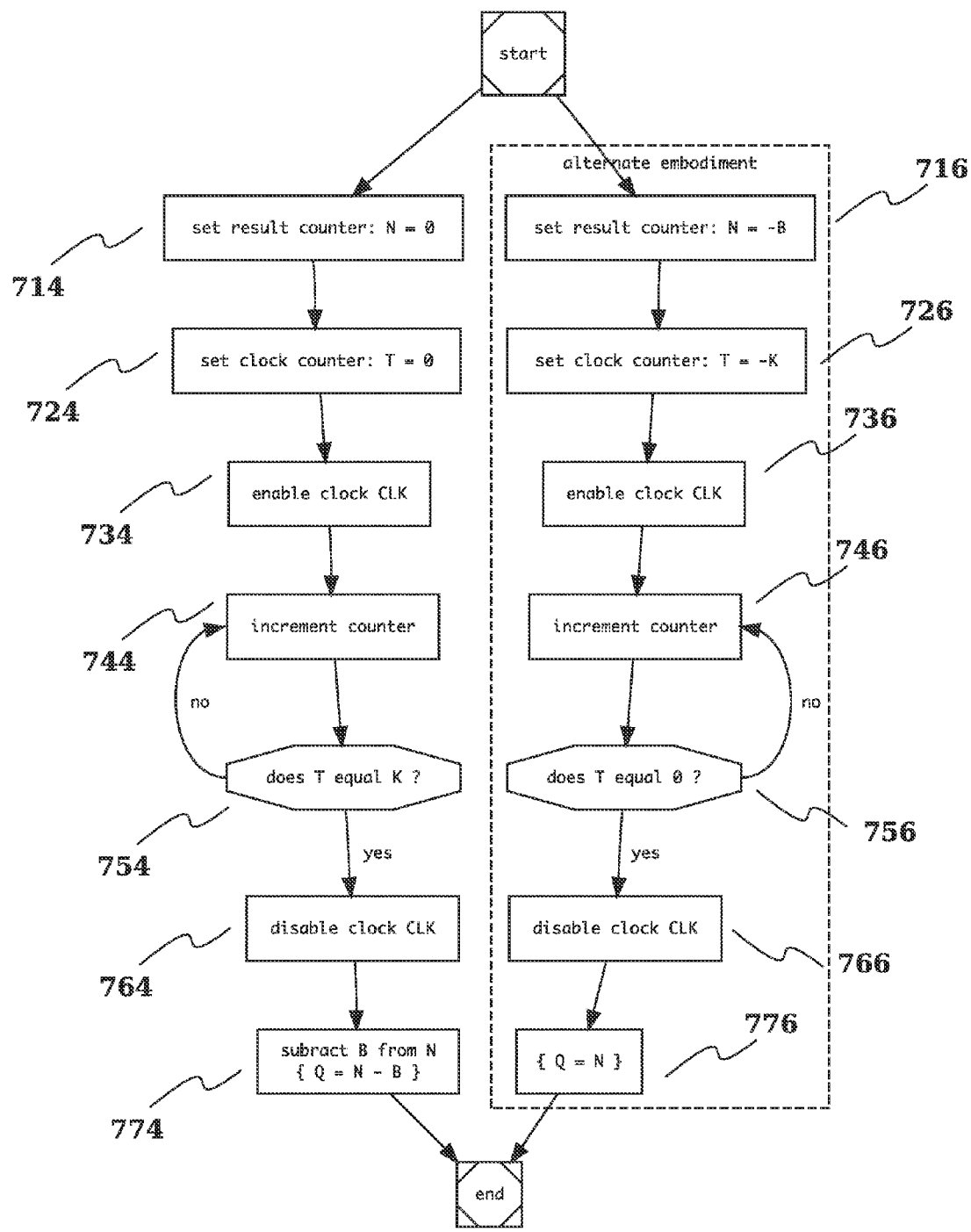
Fig. 8  Time-To-Count Mode

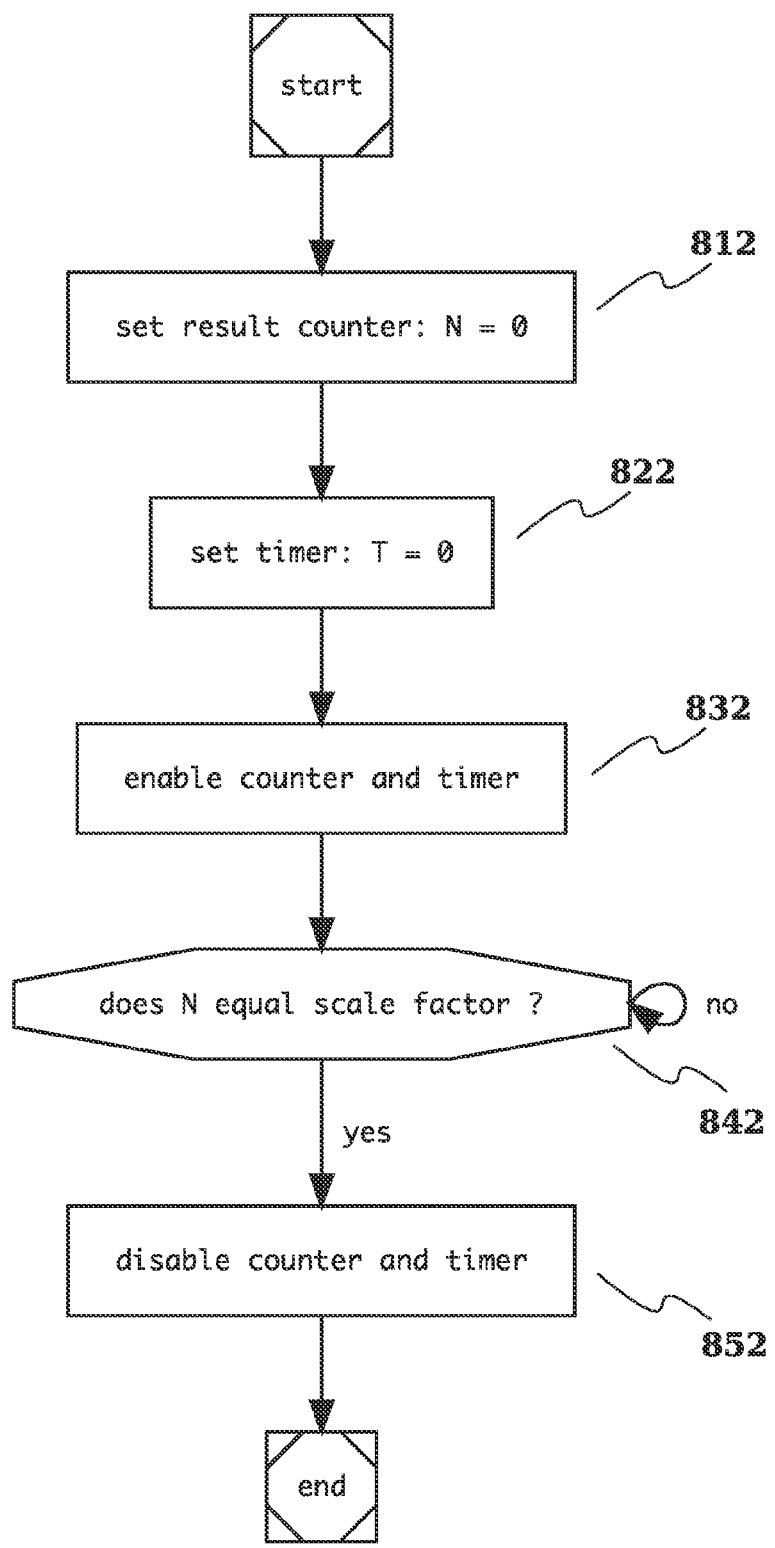
*Fig. 10 Calibration Count-To-Time*

*Fig. 11  Calibration Time-To-Count*
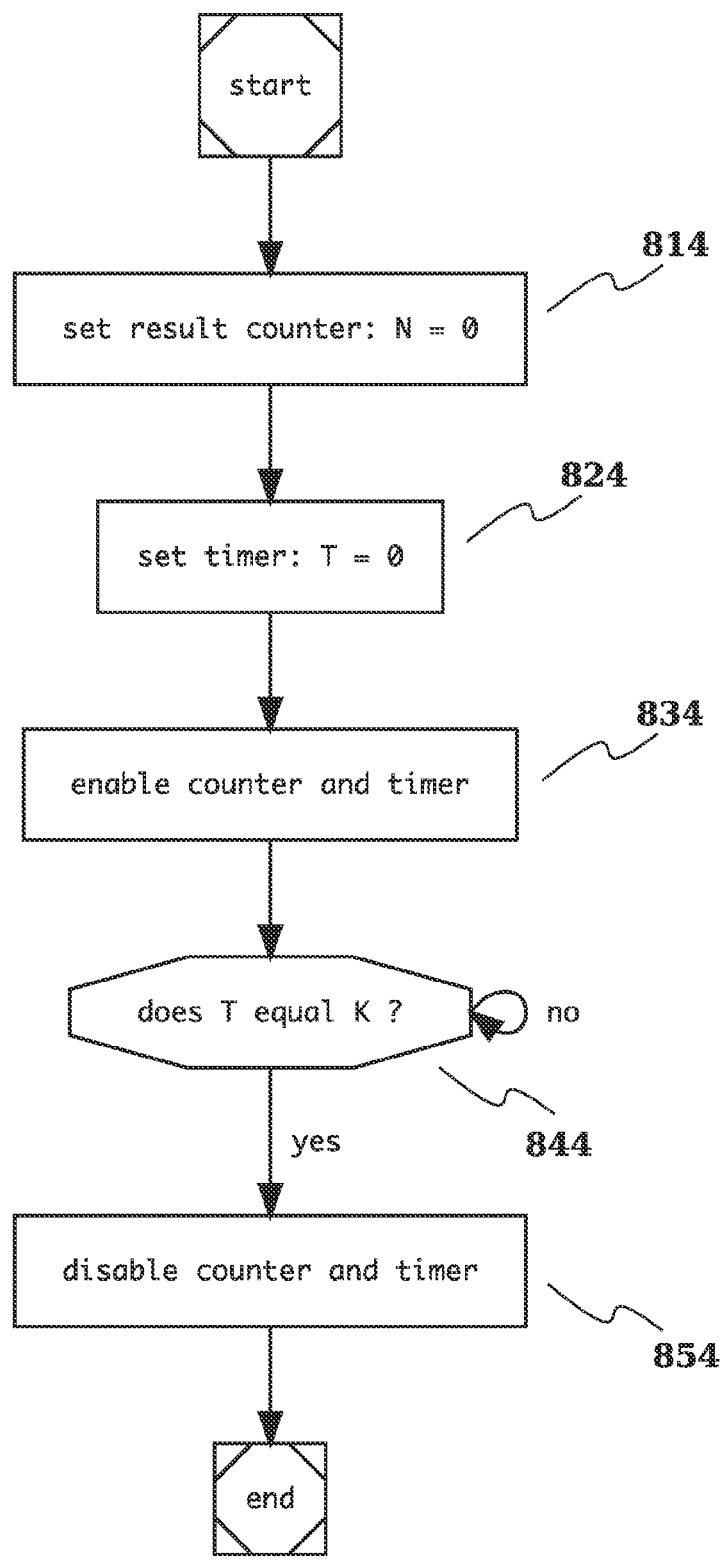

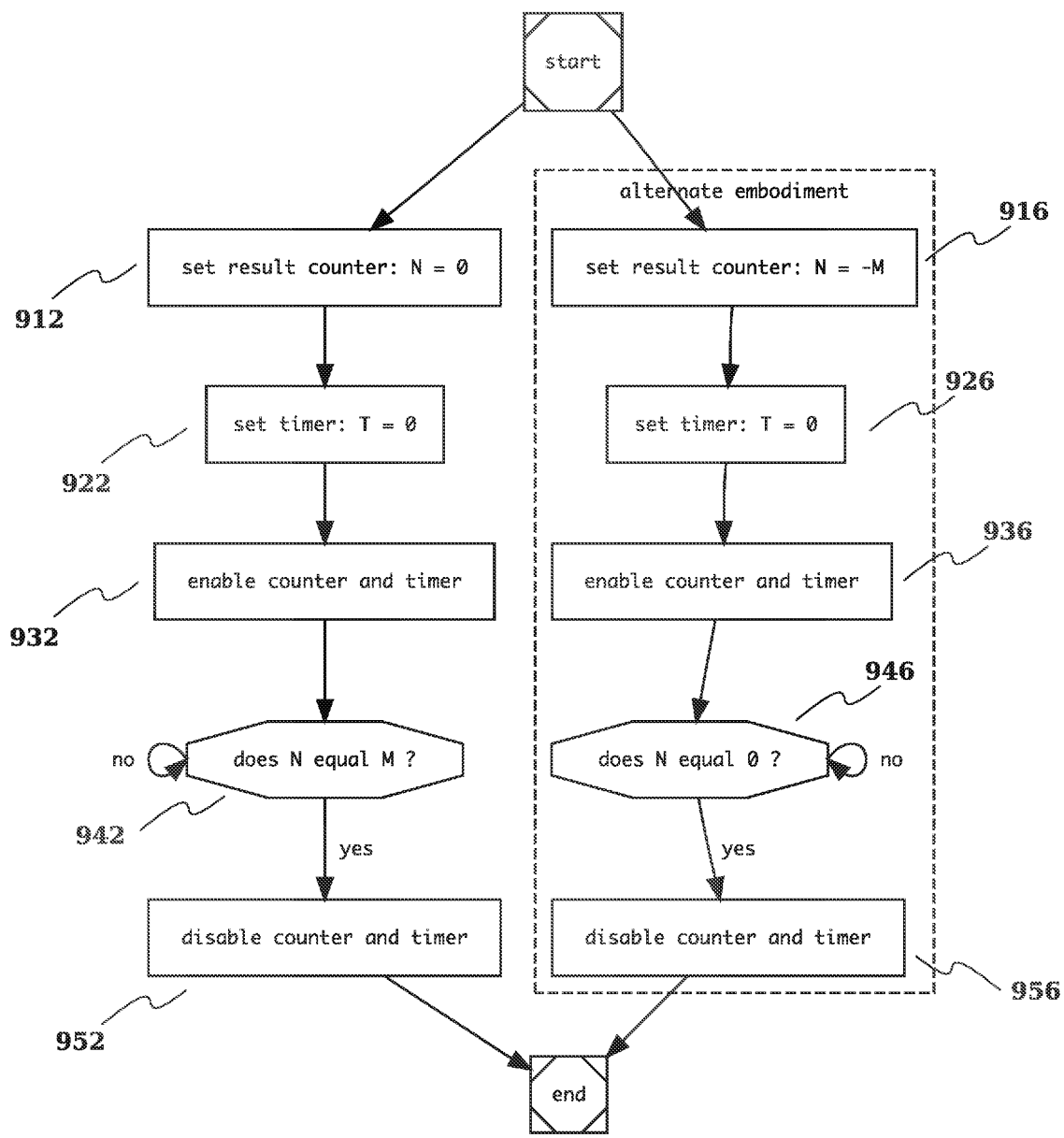
Fig. 12  Count-To-Time Mode

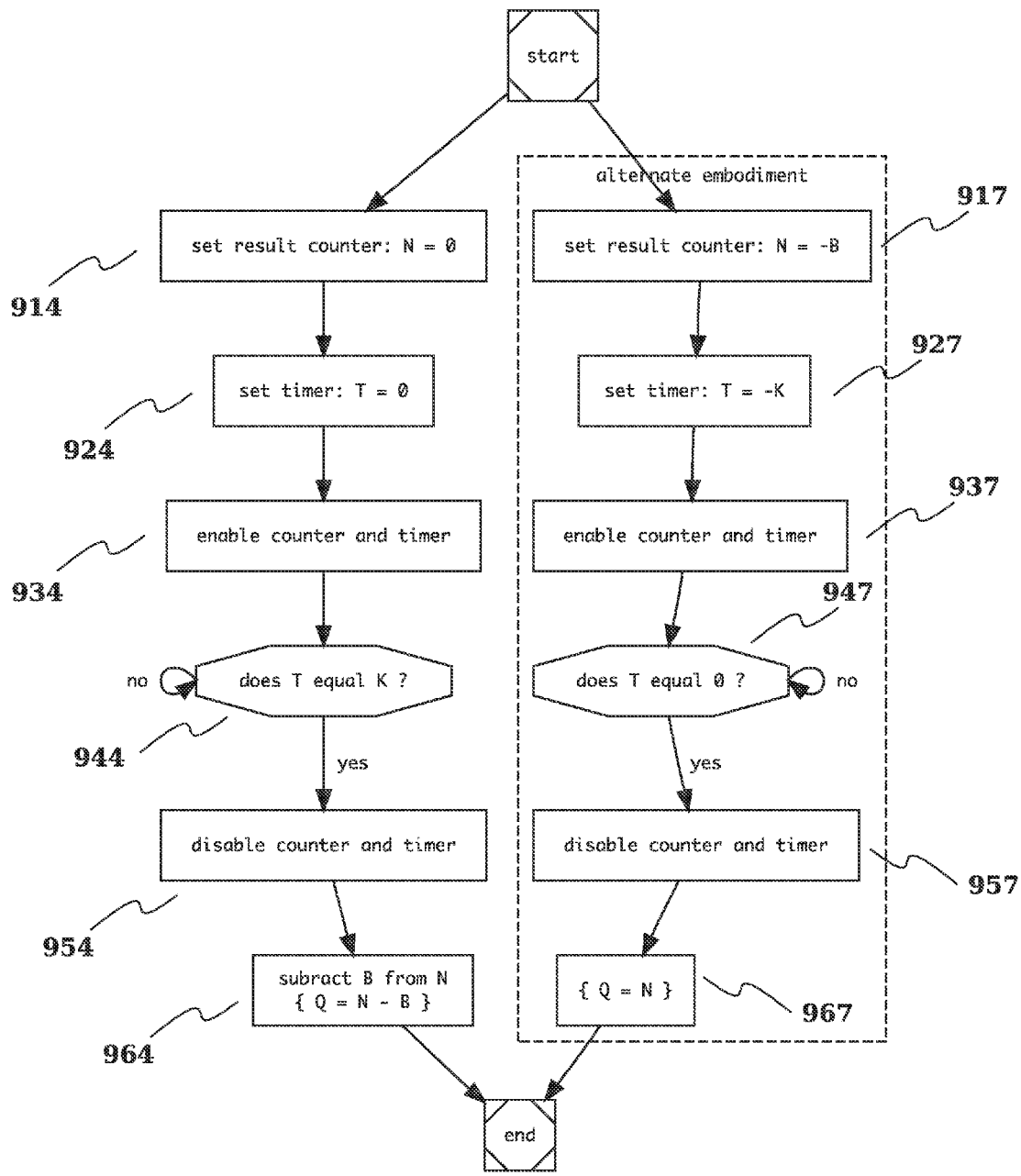
Fig. 13 Count-To-Time Mode

METHOD, SYSTEM AND APPARATUS FOR DUAL MODE OPERATION OF A CONVERTER

RELATED INFORMATION

This application is a continuation of, and claims a benefit of priority under 35 U.S.C. 120 of the filing date of U.S. patent application Ser. No. 13/529,787, filed Jun. 21, 2012, entitled "METHOD, SYSTEM AND APPARATUS FOR DUAL MODE OPERATION OF A CONVERTER", which is a continuation of, and claims a benefit of priority under 35 U.S.C. 120 of the filing date of U.S. patent application Ser. No. 13/099,665, filed May 3, 2011, entitled "METHOD, SYSTEM AND APPARATUS FOR DUAL MODE OPERATION OF A CONVERTER", issued as U.S. Pat. No. 8,228,220, which is a continuation of, and claims a benefit of priority under 35 U.S.C. 120 of the filing date of U.S. patent application Ser. No. 12/475,841, filed Jun. 1, 2009, entitled "METHOD, SYSTEM AND APPARATUS FOR DUAL MODE OPERATION OF A CONVERTER", issued as U.S. Pat. No. 7,956,777, which is a continuation of, and claims a benefit of priority under 35 U.S.C. 120 of the filing date of U.S. patent application Ser. No. 12/047,817, filed Mar. 13, 2008, entitled "METHOD, SYSTEM AND APPARATUS FOR DUAL MODE OPERATION OF A CONVERTER", issued as U.S. Pat. No. 7,551,109, which in turn claims a benefit of priority to the filing date of U.S. Provisional Patent Application Ser. No. 60/906,934, filed Mar. 14, 2007, entitled "METHOD, SYSTEM AND APPARATUS FOR DUAL MODE OPERATION OF A CONVERTER", the entire contents of which are hereby expressly incorporated by reference for all purposes.

TECHNICAL FIELD

This invention relates generally to the field of signal processing. More particularly, embodiments of the invention relate to analog signal processing. Even more specifically, embodiments of the invention relate to the field of conversion of analog signals which may be embedded in, or utilized in conjunction with, VLSI (or other types of) circuits.

BACKGROUND

Determining a level on a particular signal line is important in a wide variety of signal processing applications. These applications may include a wide variety of sensors such as temperature sensors, light sensors, decibel meters, power meters, etc. Demand for low-cost high-performance sensors which may be utilized in conjunction with complex Very Large Scale Integrated (VLSI) circuits is, in the main, being driven by the market growth of portable systems. Important applications of these types of sensors include: 1) power management in VLSI chips such as CPUs; 2) thermal system compensation for VLSI chips with embedded sensors; 3) temperature control of systems in which a VLSI chip is contained or with which a VLSI chip is utilized; 4) light or sound meters within digital recording devices such as cameras or the like; 5) sensitive touch sensors for use with input devices; etc.

In most cases, the determination of a desired signal level is accomplished by determining a ratio between the signal line for which the level is desired and one or more other signals line. Typically, this requires knowing the value of another signal lines to which the desired signal is being compared and determining the level of the unknown signal with respect to the known value of the other signal. This methodology is problematic for a number of reasons.

To begin with, to obtain an accurate result the value of the known signal need to be held constant, which may entail supporting circuitry including, for example, circuitry to achieve low impedance of the known signal. Additionally, even once the level of the desired signal is determined, to obtain a directly useful result this value must usually be scaled and calibrated which may entail an added degree of hardware of software complexity.

What is desired then are simple and robust methods, systems and apparatuses for determining the level of an input signal line, which allows any results to be easily scaled or calibrated.

SUMMARY

Methods, systems and apparatuses for operating a converter or other circuit are disclosed. More particularly, in one embodiment a converter or other circuit can be operated in two modes which may include the count-to-time and time-to count modes to determine an output value corresponding to an input signal. During operation in the count-to-time mode a converter may be operated using a reference signal to determine a number of clock cycles needed until an output corresponds to a scaling factor is reached. During operation of the circuit in the time-to-count mode then, the converter may be operated for this number of clock cycles using the input signal to determine an output. This output may be proportional to the level on the input signal.

More specifically, embodiments of the present invention include a method of delta-sigma analog to digital (A2D) conversion that allows for simple implementation, calibration and result scaling compared to existing delta-sigma conversion techniques.

In one embodiment, this predetermined scaling factor may be determined using two reference points corresponding to a desired measurement scale (as an example, temperature or luminosity). During operation in the time-to-count mode, this scaling factor may then be used to allow the circuit to be operated for a number of clock cycles substantially equal to the scaling factor.

In one embodiment, a reference signal does not have to be a different signal from the input signal, but could be the input signal itself. Additionally, the reference signal may not be static.

In one embodiment, count to time scaling outputs do not have to be dynamically generated. The count-to-time scaling outputs could be, for example, predetermined (for example, during a calibration or manufacturing process) and stored in a lookup table for comparison to realtime time to count measurements.

Embodiments of the present invention may significantly simplify the implementation, scaling and calibration of delta-sigma type A2D converters by operating the converter in two different modes, time-to-count and count-to-time. The use of these two conversion modes, time-to-count and count-to-time, provides natural cancellation of errors such as those caused by an integrator and comparator offset and switching charge-injection by making them common mode. Since embodiments of this conversion method uses time as an intermediate signal variable to control the gain of the process, it lends itself to simple methods of scaling and offset calibration.

By utilizing embodiments of the present invention to simplify the implementation and calibration of a delta-sigma A2D conversion process, analog signal processing functionality, such as smart thermal sensors and the like, can be included in a wider range of VLSI chip applications. This allows for a broader range of new functionality to be brought to the market place in a cost effect manner.

More specifically, embodiments of the present invention include a method of delta-sigma analog to digital (A2D) conversion that allows for simple implementation, calibration and result scaling compared to existing delta-sigma conversion techniques. Embodiments such as this may lend themselves particularly well to the design of a band-gap based thermal sensor, allowing the output of a delta-sigma A2D converter to be easily set to read directly in increments such as units of, for example, either Fahrenheit or Celsius.

Multiple time-to-count conversions can be done sequentially using the result of a single count-to-time conversion (for example, if the system supply voltage is considered stationary). Other values than a fixed reference may be utilized for the input during the count-to-time conversion. For example, inputs used during the count-to-time (x) and time-to-count (y) conversions can be independent variables, with the result of the conversion being proportional to $S*y/x$.

Embodiments of the systems and methods described herein may be implemented in circuitry, hardware, suitable computer-executable instructions that may be stored on a computer readable medium (e.g., a hard drive) or some combination. The computer-executable instructions may be stored, for example, as software code components on a DASD array, magnetic tape, floppy diskette, optical storage device, or other appropriate computer-readable medium or storage device.

In one exemplary embodiment of the invention, the computer-executable instructions may be lines of compiled C++, Java, HTML, or any other programming or scripting code. Other software/hardware/network architectures may be used.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 4 is a flow diagram of one embodiment of a method of operating a converter.

FIG. 6A is a flow diagram of one embodiment of a method for calibrating of a converter.

FIG. 6B is a flow diagram of one embodiment of a method for calibrating of a converter.

FIG. 6C is a flow diagram of one embodiment of a method for calibrating of a converter.

FIG. 7 is a flow diagram of one embodiment of a method of operating a converter.

FIG. 8 is a flow diagram of one embodiment of a method of operating a converter.

FIG. 10 is a flow diagram of one embodiment of a method for calibrating of a converter.

FIG. 11 is a flow diagram of one embodiment of a method for calibrating of a converter.

FIG. 12 is a flow diagram of one embodiment of a method of operating a converter.

FIG. 13 is a flow diagram of one embodiment of a method of operating a converter.

DETAILED DESCRIPTION

Figure 1:
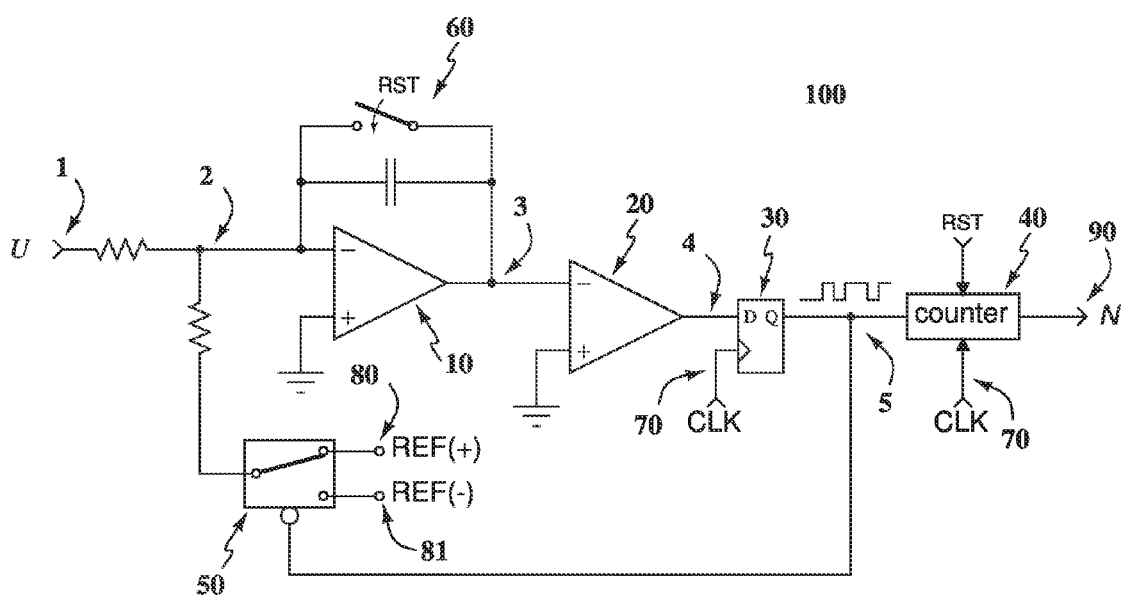
FIG. 1 is a block diagram of one embodiment of a converter.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited only those elements but may include other elements not expressly listed or inherent to such process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," "in one embodiment," etc.

Reference is now made in detail to the exemplary embodiments of the invention, examples of which are illustrated in the accompanying drawings. Wherever possible, the same reference numbers will be used throughout the drawings to refer to the same or like parts (elements).

Before discussing particular embodiments of the present invention it may be useful to explain in more detail how signal levels may be determined or utilized. This explanation may be better accomplished with reference to a specific context, in this case a sensor, and more particularly a temperature sensor. To date temperature sensors have been based on reference circuits, such as band-gap references, connected to an integrating type analog to digital converter (A2D), and in most cases, delta-sigma A2D converters which operate in a singular mode of operation, time-to-count.

A block diagram of one embodiment of just such a continuous time first-order A2D converter which may be used for a temperature sensor, light sensor, decibel meter or the like is depicted in FIG. 1. Converter 100 receives an input on input signal line 1, where the input level may correspond to desired measurement. Converter 100 includes an integrator 10, comparator 20, and a feedback loop that comprises a 1-bit digital-to-analog converter (DAC) implemented by a D type flip-flop 30 and reference value multiplexer 50, where flip-flop 30 is coupled to clock 70, the output of flip flop 30 is coupled to counter 40, and the reference value multiplexer 50 is operable to switch between reference voltages 80, 81 based upon the output of flip flop 30.

During operation of converter 100 then, the density of logical value ONES at feedback point 5 is proportional to the level on input signal 1. For an increasing value of the level at the input 1, the converter 100 generates a greater number of logical value ONES, and vice versa for a decreasing level at the input 1. By capturing the number of logical ONES generated at feedback point 5 in counter 40 for a number of cycles of clock 70 (for example, a fixed time), the ratio of the resulting output value 90 N (the number of logical ONES accumulated in counter 40 during the number of cycles of clock 70) relative to the total number of cycles of clock 70 T corresponds to the ratio of the level at input 1 relative to the reference value 80, 81. In other words, input level/reference level=REF*(2*N/T−1) which is proportional to the ratio of the number of logical ONES to the number of cycles of clock 70. This mode of operation is referred to as time-to-count. Thus, the number of logical ONES accumulated in counter 40 corresponds to a certain level at input 1, and can then be scaled or calibrated as desired (for example, to correspond to a temperature reading in a desired scale, such as Fahrenheit, Celsius or Kelvin, to correspond to sound level in decibels, etc.).

Figure 2:
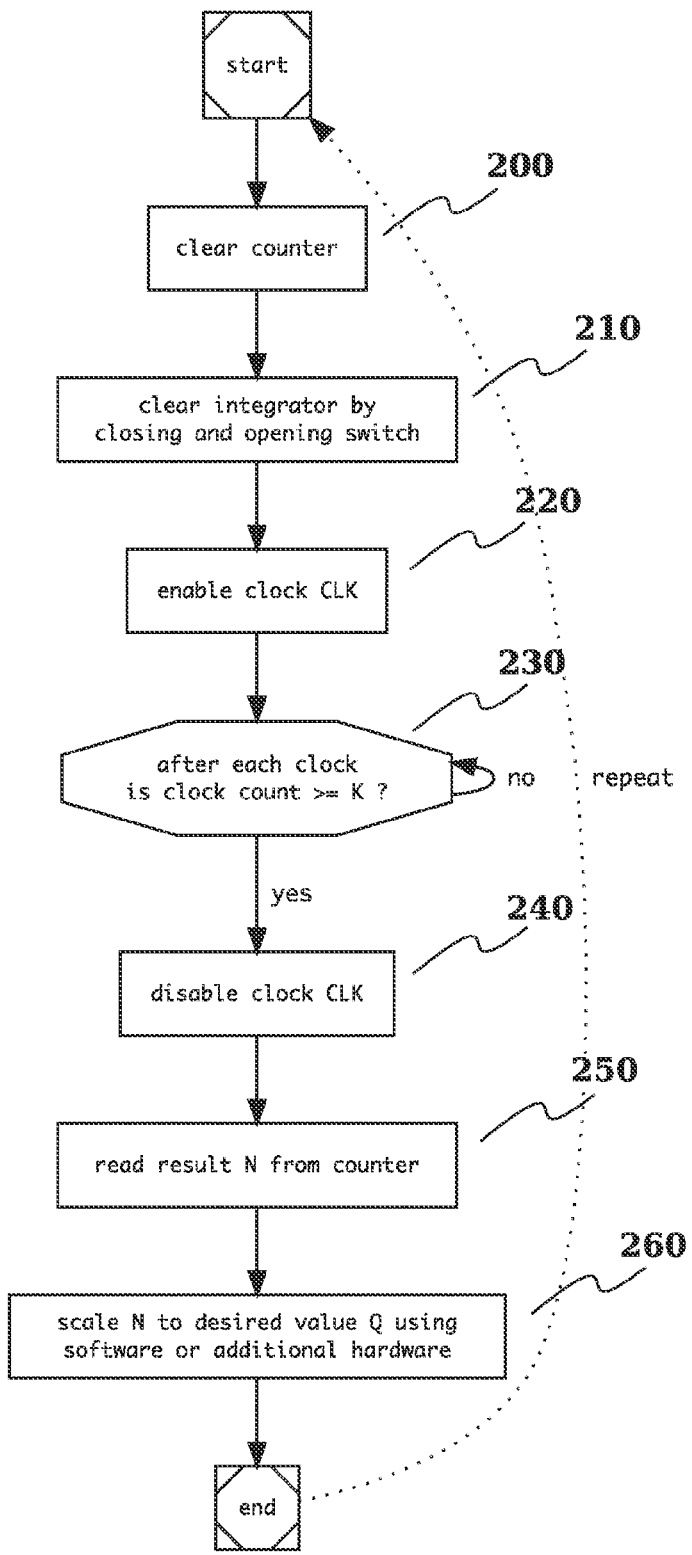
FIG. 2 is a flow diagram of one embodiment of a method of operating a converter.

FIG. 2 depicts a flow diagram of an embodiment of a method for using converter 100 in a time-to-count mode where the count time is equal to K (for example, K clock cycles). At step 200 counter 40 is cleared. Then, at step 210, integrator 10 is cleared by closing and opening switch 60. Clock 70 is then enabled at step 220. During operation of converter 100 then the number of logical ONES from flip flop 30 are accumulated in counter 40. After each clock cycle at step 230 it can be determined if the clock count T is equal to or greater than K, the count time. If the number of clock cycles T is not greater than equal to K then clock 70 continues operation, while if the number of clock cycles T is equal to, or greater than, K then clock 70 is disabled at step 240.

Once T cycles of clock 70 have been reached and clock 70 disabled, a result N corresponding to the number of logical ONES produced at the output of flip-flop 30 may be read from counter 40 at step 250. This value (N) may then be scaled to a desired value (Q) at step 260, where the scaling accounts for the level at input 1 (e.g. by using the count N as a proxy for the level at input 1, based upon the mathematical relationship of N to the level at input 1) and a desired unit. Thus, for example, an input level at input 1 may correspond to, and be used to determine, a temperature in Celsius, Fahrenheit, etc.

The type approach discussed above may exhibit a certain degree of robustness in applications where the measurement system is embedded in surrounding noisy digital circuitry. However, while the implementation of such converters may be of only moderate complexity, the circuitry or software required to scale or calibrate the output of such a converter to a directly useful value can add considerable (and undesirable) complexity.

Thus, attention is now directed to methods, systems and apparatuses which operate a converter or other circuit in two modes which may include the count-to-time and time-to-count modes to determine an output value corresponding to an input signal. More specifically, in one embodiment, during operation in the count-to-time mode a converter may be operated using a reference signal to determine a number of clock cycles needed until an output corresponds to a scaling factor is reached. During operation of the circuit in the time-to-count mode then, the converter may be operated for this number of clock cycles using the input signal to determine an output. This output may be proportional to the level on the input signal and, in one embodiment, may be proportional to the scaling factor times the ratio of the value of the input signal to the reference signal.

In one embodiment, by choosing a scaling factor based upon a desired an environmental property (for example, temperature, luminosity, sound level, etc.) the output of the time-to count mode may correspond directly to a measurement of this environmental property. Additionally, in one embodiment an offset factor may be used to adjust this output to conform to a desired scale for the corresponding measurement, in other words, the adjusted output may correspond to the measurement of the environmental property in the desired units (for example, temperature in Kelvin or Celsius, weight in grams or ounces, etc.)

The use of these two modes in conjunction with a converter may provide natural cancellation of errors such as those caused by integrator or comparator offset and switching charge-injection by making them common mode. Similarly, by operating a converter in these two different modes, simple methods of scaling and offset calibration may be utilized in conjunction with the methods, systems and apparatuses of embodiments of the present invention.

As discussed above, certain embodiments may significantly simplify the implementation, scaling and calibration of delta-sigma type A2D converters. It may be useful, therefore, to briefly discuss such A2D converters, and give a general overview of an embodiment for operating such an A2D converter. To begin such an introduction it is helpful to understand that the ability to convert continuous time signals to discrete digital values is an increasingly important requirement for an ever increasing range of applications. Electronic circuits that provide this ability are referred to as analog-to-digital converters (abbreviated ADC, A/D or A to D) and have been the subject of a wide range of research.

To meet the requirements of a variety of applications, several fundamental architectural classifications of ADC have evolved. These structural ways of implementing an ADC can be grouped as follows:
    direct conversion or flash
    successive-approximation
    ramp-compare or dual-slope integrating
    pipeline
    variable frequency oscillator delta-sigma (ΔΣ) also known as sigma-delta (ΣΔ), and other over-sampled The implementation, operation, and merits of each of these fundamental architectural classifications for ADCs are well known to those versed in the art and will not be discussed herein. For purposes of illustration the discussion in the following few paragraphs will focus on delta-sigma and other over-sampled ADC configurations. It should be understood, however, that embodiments discussed herein will also be equally applicable to other types of ADCs or converters altogether.

Of these types of converters, delta-sigma converters have become the natural choice for analog to digital conversion in applications with low to medium bandwidth requirements and have virtually replaced the integrating type ADC for applications requiring high resolution (16 to 24) bits. Delta-sigma converters are particularly amenable to VLSI implementation because circuit precision requirements can be significantly relaxed by utilizing a high oversampling ratio $$\left(\frac{f_{clock}}{f_{signal}}\right),$$

in effect trading resolution in time for resolution in amplitude.

In conjunction with such delta-sigma and oversampling ADCs, in one embodiment a dual mode of operation that provides the direct calculation of the scaled ratio of two input signals $$\left(m*\frac{a}{b}\right)$$

with minimal additional overhead may be utilized. This particular embodiment will now be described generally. While not constraining the application of any embodiments described (or other embodiments), for clarity of explanation the operation of the invention will be described, in this example, in the context of an analog first-order delta-sigma (ΔΣ) ADC.

Figure 3:
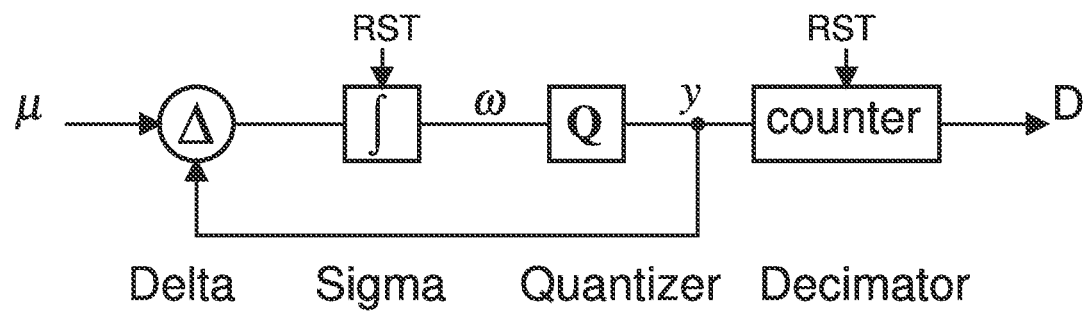
FIG. 3 is a block diagram of one embodiment of converter.

As depicted in FIG. 3, in one embodiment an analog first-order ΔΣ converter comprises of a difference (delta) stage whose output is then summed (sigma), quantized (Q) and the resulting bit-stream then captured by a decimator (or counter). This process of converting an analog input u into a bit-stream y[i], using an accumulator can be described by the following equations:

$$w[0]=0 \tag{1}$$

$$w[i+1]=w[i]+\alpha(u-y[i]), i=0,\ldots N-1 \tag{2}$$

where typically α=1 and the single-bit quantizer is:

$$y[0]≡0 \tag{3}$$

$$y[i]=\text{sign}(w[i]-\tfrac{1}{2}), i=1,\ldots N \tag{4}$$

A binary counter accumulates the bit-stream y[i] such that $$\sum_{i=0}^{N} y[i] = D \tag{5}$$

producing the decimated result D. For u within the conversion range [0, 1] (in dimensionless units), $$\lim_{N\to\infty} \frac{D}{N} = u \tag{6}$$

$$D = u \cdot N \tag{7}$$

As each sample event i corresponds to a unit of time, the result of the ΔΣ process may represent one embodiment of a time to count conversion.

As a second mode of operation, in one embodiment the ΔΣ converter is operated in a way such that the result is proportional to the inverse of u.

One embodiment of a method of accomplishing this mode of operation comprise of pre-loading the counter with the value –D and operating the ΔΣ converter until the value of the counter equals zero while keeping track of the total time N.

$$\text{operate until} \Rightarrow \sum_{i=0}^{N} y[i] - D = 0 \tag{8}$$

$$N = \frac{D}{u} \tag{9}$$

The result of this inverse ΔΣ process may represent one embodiment of a count to time conversion.

By appropriately alternating operation of the ΔΣ converter between time-to-count and count-to-time modes, the direct calculation of the ratio (R) of two input values {a, b} can be calculated. Although the following example is illustrated with count-to-time followed by time-to-count, the actual order of operation is not important and may be reversed or one mode of operation eliminated altogether during certain applications. To illustrate this alternation: assuming the first input value is b, then perform a count-to-time conversion (9)

$$b \equiv u, m \equiv D \Rightarrow N = \frac{m}{b} \tag{10}$$

Letting the second input value be a, perform a time-to-count conversion (7) using the result N from (10)

$$a \equiv u, R \equiv D \Rightarrow R = N \cdot a \tag{11}$$

$$R = \frac{m}{b} \cdot a \tag{12}$$

By pre-loading the counter with a constant value C before the start of operation in the time-to-count mode (12) that the resulting value is $$R = m \cdot \frac{a}{b} + C \tag{13}$$

By appropriately selection of the values of m and C, arbitrary units and precision of R as a function $f(a,b)$ can be arbitrarily set as desired.

Furthermore, it may be desired to select values of m and C such that operation of the dual mode the converter directly produces a specific mapping $$R[i] \Rightarrow F[i] \tag{14}$$

One embodiment of a method of accomplishing this mapping is by first letting m=K, where K is an arbitrarily large constant and performing a dual mode conversion using (12) for two known values of {a, b}

$$K \cdot \frac{a[1]}{b[1]} = R[1] \Rightarrow F[1] \quad (15)$$

$$K \cdot \frac{a[2]}{b[2]} = R[2] \Rightarrow F[2] \quad (16)$$

The desired scaling factor $m_d$ and offset factor $C_d$ can be calculated as $$m_d = K \cdot \text{abs}\left(\frac{F[2] - F[1]}{R[2] - R[1]}\right) \quad (17)$$

$$C_d = \frac{K \cdot a[1]}{m_d \cdot b[1]} + F[1] \quad (18)$$

This ability to directly and simply produce a result R from an ADC that is the ratio of two input values is useful in a variety of fields as will be noted from a review of the present application.

Turning now at FIG. 4, a flow diagram for one embodiment of a method for dual mode operation of a converter is depicted. Initially a scaling factor may be determined at step 310, where the scaling factor may be determined using two known values corresponding to the level of the input signal of the converter. For example, if the converter is to be utilized in a temperature sensor such that the input signal corresponds to, or varies with, a temperature, the two known values may correspond to two different temperatures.

Using this determined scaling factor an offset may be determined at step 320. This offset may be used in conjunction with the output of the converter to allow the output of the converter circuit to correspond directly to a desired scale. For example, to allow the output of a converter circuit used in conjunction with a temperature sensor to correspond to a temperature in degrees Celsius or Fahrenheit, the output of a converter used in conjunction with a sound meter to correspond to a sound level in decibels, etc.

After determining the scaling factor and the offset the converter may be operated at steps 330 and 340. At step 330 using a reference signal as input, the converter may be operated in the count-to-time mode to determine a number of clock cycles taken for the output of the converter to reach the scaling factor.

Using the number of clock cycles determined at step 330 then the converter may be operated in the time-to-count mode using a desired input signal as input, such as the output from a reference circuit such as a temperature sensor (such as a sensitive diode or the like), a sound meter, etc. In the time-to-count mode the converter may be operated for the number of clocks determined at step 330 to determine an output of the converter that occur during the determined number of clock cycles using the desired input signal. This output corresponds to the desired measurement and can, if desired, be adjusted to the desired scale using the offset determined at step 320.

After a review of the above method it will be noted that certain of the steps may be repeated without repeating other of those steps and that the order of the steps depicted in FIG. 4 is provided by way of example. Each of the various steps may be repeated without repeating other steps and the steps may be performed in a variety of different orders.

For example, after determining a scaling factor at step 310 (and optionally an offset at step 320) the converter may be operated in the count-to-time mode at step 330 and the time-to-count mode at step 340 multiple times using the determined scaling factor (and, optionally, the same offset). Along the same lines, multiple outputs may be obtained from a converter by operating the converter multiple times in the time-to-count mode at step 340 using the same number of clocks previously determined at step 330. Similarly if, for example, a user wishes to obtain a readout in a different scale a new offset may be determined at step 320 and an output may be obtained from the converter by operating the converter in the time-to-count mode at step 340 using a number of clocks previously determined at step 330, without again determining a scaling factor at step 310 or operating the converter in the count-to-time mode at step 330. Other permutations are possible as well, and will not be discussed in detail herein. However, it is important to note that the ability to perform certain steps independently or in differing orders may have a number of advantageous implications, including allowing multiple outputs to be rapidly obtained and converters or sensors to be relatively easily calibrated and operated.

The steps discussed with respect to FIG. 4 will now be discussed in more detail. It may be helpful to a reader to discuss these steps in conjunction with a concrete example of an embodiment of a converter with which embodiments of these steps may be utilized. To that end, attention is now directed to FIGS. 5A and 5B.

Figure 5A:
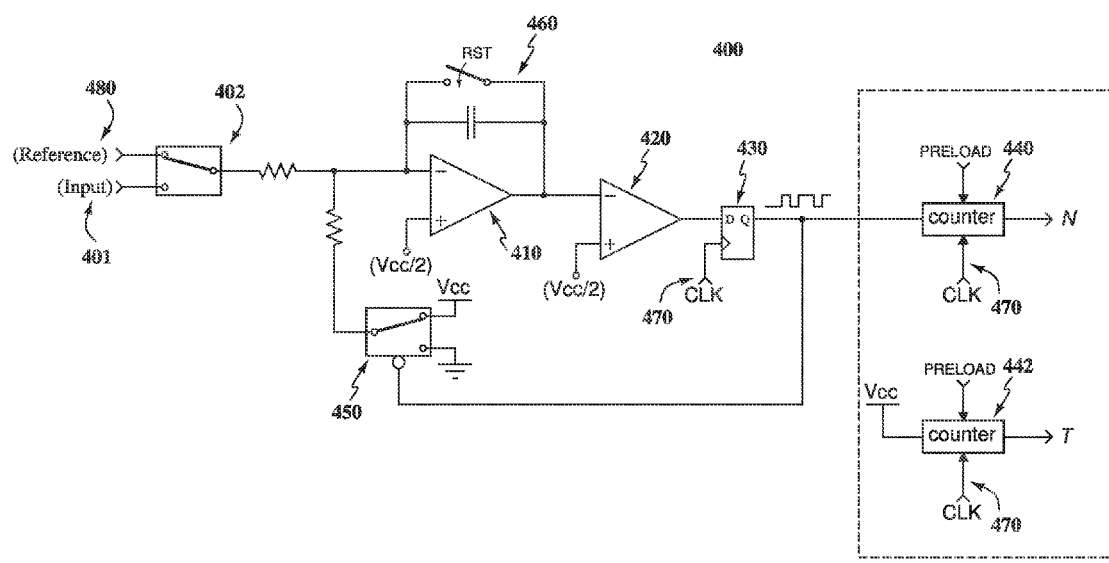
FIG. 5A is a block diagram of one embodiment of a converter.

FIG. 5A depicts one embodiment of a converter 400, comprising a multiplexer 402 operable to switch between a reference signal 480 and an input signal 401. Input signal 401 may be coupled to, for example, a reference circuit where at least one output of the reference circuit may vary in accordance with an environmental property and thus have a certain value (for example, a level) corresponding to a measurement (for example, a temperature sensitive circuit such as a diode whose output varies with temperature, etc.).

The output of multiplexer 402 is coupled to an integrator 410 having a switch 460, the output of which is coupled to comparator 420. Comparator 420 is, in turn, coupled to flip flop 430 clocked by clock 470. The output of flip flop 430 is coupled to counter 440 operable to count the number of logical ONES on the output of flip flop 430 and clocked by clock 470. The output of flip flop 430 is also coupled to multiplexer 450 operable to switch between an arbitrary voltage level (for example, a system supply voltage (Vcc) or the like), which may in one embodiment may be assumed to be substantially stationary for the period of operation of the converter, and ground. The output of the multiplexer 450 is coupled to the input of integrator 410 to create a feedback loop. Converter 400 may also include counter 442 operable to count, for example, a number of cycles of clock 470.

Figure 5B:
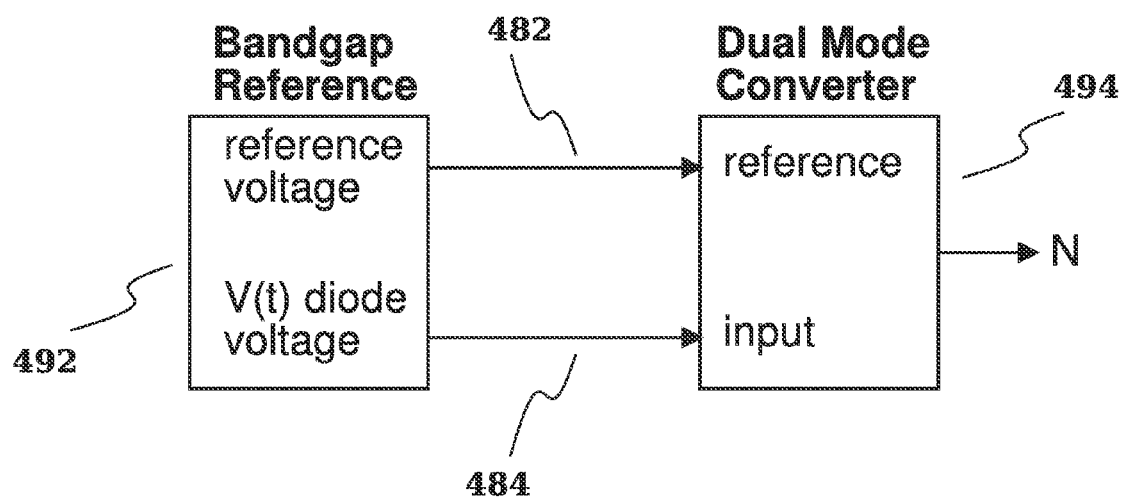
FIG. 5B is a block diagram of one embodiment of a temperature sensor utilizing one embodiment of a converter.

Turning to FIG. 5B, one embodiment of a temperature sensor 490 which may utilize an embodiment of a converter such as that discussed with respect to FIG. 5A is depicted. Temperature sensor 490 may comprise band-gap reference 492 and converter 494, which may be an embodiment of a converter such as that depicted in FIG. 5A. The output of band-gap reference 492 comprises a reference signal 482 and an output signal 484 from a diode whose output level varies with temperature. The reference signal 482 is coupled to the reference signal input of converter 494 while the output signal 484 of band-gap reference 492 is coupled to the input signal of converter 494.

It will be noted that the functionality depicted in FIG. 5A or 5B may be implemented in hardware, software or some combination of the two. For example, both counters 440 and counter 442 may be implemented in hardware or software. Similarly, it will be understood with respect to the descriptions of the embodiments of the systems and methods discussed herein that the functionality discussed with respect to various steps or operations may also be accomplished in hardware, software or some combination of the two, such as by a controller which is operable to implement one or more of the steps discussed in conjunction with the embodiments of the methods presented herein, wherein the controller may comprise hardware (such as circuitry or other logic, etc.), software (such as computer readable instructions, etc.) or some combination of the two.

It should also be noted that though embodiments of the present invention may be useful for implementation in conjunction with certain types of sensors (such as temperature sensors), and it is in this context that certain embodiments of the present invention and examples thereof will be described, embodiments of the present invention may be similarly be utilized in any method, system or apparatus where converters are utilized or any method or system or apparatus where it is desired to simplify the implementation, scaling or calibration of a converter or reduce the complexity of the scaling or calibration of a converter.

With that in mind, reference is again made briefly to FIG. 4. As discussed previously, a scaling factor and offset may be determined for a converter at steps 310 and 320. Turning now to FIGS. 6A, 6B and 6C one embodiment of a methodology for determining a scaling factor for a converter is depicted. Referring first to FIG. 6A, a flow diagram for one embodiment of a method for calibrating the converter is depicted. Initially, at step 510 an initial scaling factor (which may be any value desired) may be chosen. Using the reference value as input then, at step 520 the converter may operated in a count-to-time mode to obtain a count of the number of clock cycles taken for a count of the output of the converter to reach the initial scaling factor. Using the clock count determined at step 520 a calibration count for a first known value of the desired measurement may be obtained at step 530 followed by obtaining a calibration count at step 540 for a second known value of the desired measurement.

The calibration counts are determined by operating the converter in a time-to-count mode where the input signal is used as input to the converter and the converter is operated in accordance with the known value, which may comprise, operating the converter at, or in the presence of, the known value. For example, for calibration where the measurement is temperature the converter may be calibrated for a known value by substantially holding the converter (or the temperature sensor with which it is being utilized) at the known temperature while obtaining a calibration count for that known value. Similarly, where the measurement is sound level, the converter may be calibrated for a known value by producing substantially the known sound level while calibrating the converter for the known value. Using the two calibration counts obtained at step 530 and 540, then and the two known measurement values the scaling factor can then be calculated at step 550 and optionally an offset can be calculated at step 560.

Thus, to calibrate the converter first the converter may be operated in a count-to-time mode as depicted in FIG. 6B. Here an arbitrary initial scaling factor may be chosen and using the reference signal as input a count of the number of clock cycles taken for a count of the output of the converter to reach the arbitrary initial scaling factor may be determined. For example, with respect to converter 400, an arbitrary scaling factor (Ma) may be chosen and reference signal 480 selected as input to the converter 400. At steps 512 and 522 then, counter 440 and counter 442 may be cleared. Clock 470 is then enabled at step 532. The clock count (T) in counter 442 is then incremented with each clock cycle at step 542 and after each cycle of clock 470 it can then be determined if the value in output counter 440 is equal to the arbitrary scaling factor (Ma) at step 552. If so, then clock 470 is then disabled at step 562.

Moving to FIG. 6C, to obtain a calibration count for a known value, then the converter may be operated in a time-to-count mode in accordance with the known value using the input signal as input. Here, a calibration count for a known value can be determined by obtaining a count of the output of the converter during a number of clock cycles corresponding to the clock count determined in the count-to-time calibration. Specifically, with respect to converter 400, operating in accordance with the known value, input signal 401 may be selected as input to converter 400 and at steps 514 and 524 counter 440 and counter 442 may be cleared. At step 534 then, clock 470 may be enabled and the counter 442 incremented at step 544. After each cycle of clock 470 it can then be determined at step 554 if the value in counter 442 is equal to the clock count (K) resulting from the count-to-time calibration (discussed in FIG. 6B). If so, clock 470 may be disabled at step 564. The count in counter 440 can then be used as the calibration count for the known value.

Returning to briefly to FIG. 6A, after calibration counts are determined for each of two known values the calibration counts and known values may be used to calculate a scaling factor for the converter corresponding using the formula: Scaling factor=initial scaling factor*abs((first known value−second known value)/(first calibration count−second calibration count)). Using the determined scaling factor then an offset can be determined using one of the known values (for example the known value in the desired scale) expressed in the desired scale using the formula: Offset=((scaling factor divided by the initial scaling factor)*first calibration count) plus first known value (in the desired scale).

With reference now to back to FIG. 4, once the scaling factor is determined (and optionally any offset) the converter may be operated in the count-to-time mode at step 330 and the time-to-count mode at step 340 to obtain a desired output corresponding to a level on an input signal. FIG. 7 depicts one embodiment of operating a converter in a count-to-time mode using a determined scaling factor. Here a count of the number of clock cycles taken for a count of the output of the converter to reach the determined scaling factor using a reference signal as input to the converter may be determined. For example, with respect to converter 400, a previously determined scaling factor (M) may be used and reference signal 480 selected as input to the converter 400. At steps 612 and 622 then, counter 440 and counter 442 may be cleared. Clock 470 is then enabled at step 632. The clock count (T) in counter 442 is then incremented with each clock cycle at step 642 and after each cycle of clock 470 it can then be determined if the value in counter 440 is equal to the scaling factor (M) at step 652. If so, then clock 470 is then disabled at step 662. The resulting value T in counter 442 represents the time to reach the scaling factor when using the reference signal as input.

As was noted earlier the functionality of various portions of a converter or hardware or software utilized in conjunction with certain embodiments may vary. For example, by utilizing up/down counters or adders or subtractors, two's complement arithmetic, decimators in conjunction with counters 440 and 442. In such a case, operating converter at 400 may comprise, for example, setting counter 440 to the negative value of the scaling factor (−M) clearing counter 442 at steps 616 and 626. Clock 470 is then enabled at step 636. The clock count (T) in counter 442 is then incremented with each clock cycle at step 646 and after each cycle of clock 470 it can then be determined if the value in counter 440 is equal to zero at step 656. If so, then clock 470 is then disabled at step 676.

In either case the resulting clock count (which will be referred to as K) may then be used during operation of the converter in the time-to-count mode to obtain a desired output corresponding to the input signal. FIG. 8 depicts one embodiment a method for operating a converter in the time-to-count mode. Here, an output corresponding to the level on the input signal may be determined by counting the output of the converter during a number of clock cycles corresponding to the clock count (K) using the input signal. Specifically, with respect to converter 400, input signal 401 may be selected as input to converter 400 and at steps 714 and 724 counter 440 and counter 442 may be cleared. At step 734 then, clock 470 may be enabled and the counter 442 incremented with each clock cycle at step 744. After each cycle of clock 470 it can then be determined at step 754 if the value T in counter 442 is equal to the clock count (K). If so, clock 470 may be disabled at step 764. The count N in counter 440 then corresponds to a measurement associated with the value of input signal 401. This count can then be adjusted at step 774 by subtracting the offset (B) from the count to yield an output which represents a measurement in a desired scale.

Again, the functionality of various portions of a converter or hardware or software utilized in conjunction with certain embodiments may vary. For example, in certain cases operating converter at 400 may comprise, for example, setting counter 440 to the negative value of the offset (−B) at step 716 and at step 726 setting counter 442 to the negative value of the clock count (−K). At step 736 then, clock 470 may be enabled and counter 442 incremented with each clock cycle at step 746. After each cycle of clock 470 it can then be determined at step 756 if the value in counter 442 is equal to 0. If so, clock 470 may be disabled at step 766. The count in counter 440 then corresponds to a measurement associated with the value of input signal 401 adjusted by the offset (B).

An example will be helpful in illustrating the embodiments discussed above. With reference to FIGS. 5A and 5B for this example, assume for purposes of this example that the bandgap 492 reference voltage output 482 is set to 0.8 volts and that the diode output voltage 484 changes approximately 2 mv/degree C. and varies from approximately 0.7 v to 0.46 v over the range of 0-120 degrees C. The diode output voltage 484 versus temperature is described in the following table:

| Temperature | 0 | 20 | 40 | 60 | 80 | 100 | 120 |
|---|---|---|---|---|---|---|---|
| Diode voltage | 0.7 | 0.66 | 0.62 | 0.58 | 0.54 | 0.50 | 0.46 |

Suppose now that it is desired that the output of the converter 494 corresponds directly to degrees Celsius. Scaling M and offset B constants may be calculated in this example as follows:

(a) an initial scaling factor (Ma) is chosen, here assume 10000

(b) the offset factor is set to zero, B=0

(c) the calibration is run for two known temperature points, for example 40 C and 100 C Assume now that the system voltage Vcc=1.5 and the following results are obtained:

| Temperature | 40 | 100 |
|---|---|---|
| Calibration Count | 7750 | 6250 |

The new scaling factor S is then calculated by the formula:

$$M = Ma * abs((T1-T2)/(C1-C2)) = Ma * abs((40-100)/(7750-6250)) = 400$$

The offset factor K can then be calculated by the following formula:

$$B = ((M/Ma) * C1) + T1 = ((400/10000) * 7750) + 40 = 350$$

An example of the operation of converter 400 at steps 330 and 340 is as follows:

(a) assume the operating temperature is 60 C and Vcc=1.8

(b) after operating converter 400 in the count-to-time mode of the conversion using M=400, B=350 the clock counter 442 will contain the value T=900

(c) after operating converter 400 in the time-to-count mode, the result in counter 440 corresponds to 60, the operating temperature.

After thoroughly reviewing the above discussion it will be noted that the systems, methods and apparatuses need not be utilized in conjunction with or comprise delta-sigma (ΔΣ) converters and may use, or be used in conjunction with virtually any other type of converter. It may be helpful then to give another example of one embodiment of another type of converter and its use in conjunction with certain embodiments of the systems, methods and apparatuses discussed.

Figure 9A:
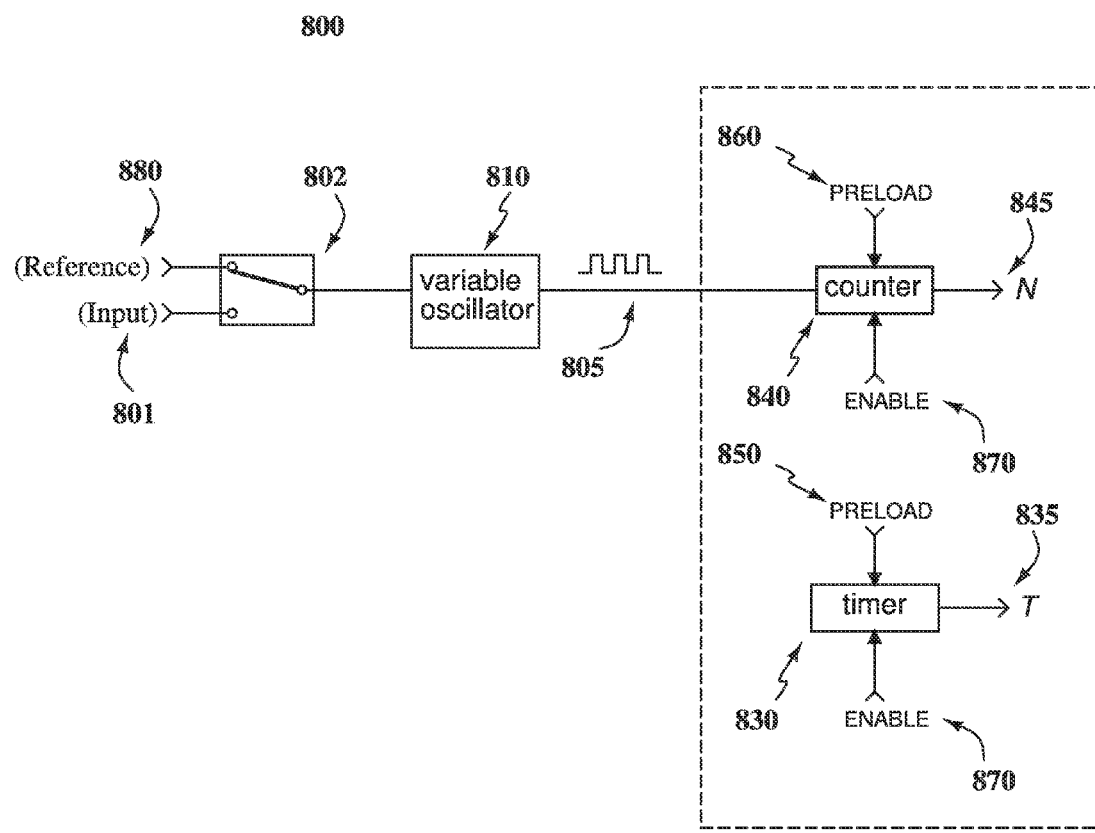
FIG. 9A is a block diagram of one embodiment of a converter.

FIG. 9A depicts one embodiment of a converter 800, based on a variable frequency oscillator. Converter 800 is comprised of a multiplexer 802 operable to switch between a reference signal 880 and an input signal 801. Input signal 801 may be coupled to, for example, a reference circuit where at least one output of the reference circuit may vary in accordance with an environmental property and thus have a certain value (for example, a level) corresponding to a measurement (for example, a temperature sensitive circuit such as a diode whose output varies with temperature, etc.).

The output of multiplexer 802 is coupled to a controlling input of a variable frequency oscillator 810. The frequency controlling input may comprise a variety of different signals or values in different embodiments (for example, voltage, current, capacitance, resistance, etc.). The output of variable oscillator 810 is coupled to counter 840 operable to count or measure the frequency of the output of variable oscillator 810. Converter 800 may also include timer 830 operable to measure, for example, a given period of time.

Figure 9B:
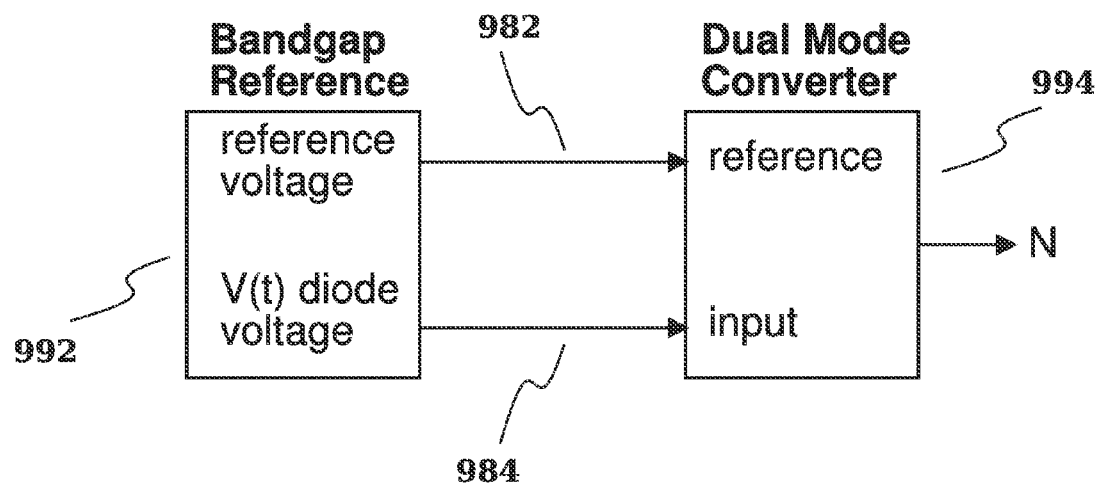
FIG. 9B is a block diagram of one embodiment of a temperature sensor utilizing one embodiment of a converter.

Turning to FIG. 9B, one embodiment of a temperature sensor 990 which may utilize an embodiment of a converter such as that discussed with respect to FIG. 9A is depicted. Temperature sensor 990 may comprise band-gap reference 992 and converter 994, which may be an embodiment of a converter such as that depicted in FIG. 9A. The output of band-gap reference 992 comprises a reference signal 982 and an output signal 984 from a diode whose output level varies with temperature. The reference signal 982 is coupled to the reference signal input of converter 994 while the output signal 984 of band-gap reference 992 is coupled to the input signal of converter 994.

It will be noted that the functionality depicted in FIG. 9A or 9B may be implemented in hardware, software or some combination of the two. For example, both counters 840 and counter 830 may be implemented in hardware or software. Similarly, it will be understood with respect to the descriptions of the embodiments of the systems and methods discussed herein that the functionality discussed with respect to various steps or operations may also be accomplished in hardware, software or some combination of the two, such as by a controller which is operable to implement one or more of the steps discussed in conjunction with the embodiments of the methods presented herein, wherein the controller may comprise hardware (such as circuitry or other logic, etc.), software (such as computer readable instructions, etc.) or some combination of the two.

It should also be noted that though embodiments of the present invention may be useful for implementation in conjunction with certain types of sensors (such as temperature sensors), and it is in this context that certain embodiments of the present invention and examples thereof will be described, embodiments of the present invention may be similarly be utilized in any method, system or apparatus where converters are utilized or any method or system or apparatus where it is desired to simplify the implementation, scaling or calibration of a converter or reduce the complexity of the scaling or calibration of a converter.

With that in mind, reference is again made briefly to FIG. 4. As discussed previously, in one embodiment, a scaling factor and offset may be determined for a converter at steps 310 and 320. Turning now to FIGS. 6A, 10 and 11, utilizing these FIGURES one embodiment of a methodology for determining a scaling factor for a converter such as that depicted in FIG. 9A will be depicted.

Referring first to FIG. 6A, a flow diagram for one embodiment of a method for calibrating a converter is depicted. Initially, at step 510 an initial scaling factor (which may be any value desired) may be chosen. Using the reference value as input then, at step 520 the converter may be operated in a count-to-time mode to obtain a count of the time taken for a count of the output of the converter to reach the initial scaling factor. Using the time count determined at step 520 a calibration count for a first known value of the desired measurement may be obtained at step 530 followed by obtaining a calibration count at step 540 for a second known value of the desired measurement.

The calibration counts are determined by operating the converter in a time-to-count mode where the input signal is used as input to the converter and the converter is operated in accordance with the known value, which may comprise, operating the converter at, or in the presence of, the known value. For example, for calibration where the measurement is temperature the converter may be calibrated for a known value by substantially holding the converter (or the temperature sensor with which it is being utilized) at the known temperature while obtaining a calibration count for that known value. Similarly, where the measurement is sound level, the converter may be calibrated for a known value by producing substantially the known sound level while calibrating the converter for the known value. Using the two calibration counts obtained at step 530 and 540, then and the two known measurement values the scaling factor can then be calculated at step 550 and optionally an offset can be calculated at step 560.

Thus, to calibrate the converter first the converter may be operated in a count-to-time mode as depicted in FIG. 10. Here an arbitrary initial scaling factor may be chosen and using the reference signal as input a count of the time taken for a count of the output of the converter to reach the arbitrary initial scaling factor may be determined. For example, with respect to converter 800, an arbitrary scaling factor (Ma) may be chosen and reference signal 880 selected as input to the converter 800. At steps 812 and 822 then, counter 840 and timer 830 may be cleared. Counter 840 and timer 830 are then enabled at step 832. The count (N) value in counter 840 is then incremented as a function of the output 805 of variable oscillator 810. After each cycle of 805 it can then be determined if the value in output counter 840 is equal to the arbitrary scaling factor (Ma) at step 842. If so, counter 840 and timer 830 are then disabled at step 852.

Moving to FIG. 11, to obtain a calibration count for a known value, then the converter may be operated in a time-to-count mode in accordance with the known value using the input signal as input. Here, a calibration count for a known value can be determined by obtaining a count of the output of the converter during a period of time corresponding that determined in the count-to-time calibration. Specifically, with respect to converter 800, operating in accordance with the known value, input signal 801 may be selected as input to converter 800 and at steps 814 and 824 counter 840 and timer 830 may be cleared. At step 834 then, counter 840 and timer 830 may be enabled. The count (N) value in counter 840 is then incremented as a function of the output 805 of variable oscillator 810. After each increment of the value (T) of timer 830 it can be determined if the value in timer 830 is equal to the clock count (K) resulting from the count-to-time calibration (discussed in FIG. 10). If so, counter 840 and timer 830 may be disabled at step 854. The count in counter 840 can then be used as the calibration count for the known value.

Returning to briefly to FIG. 6A, after calibration counts are determined for each of two known values the calibration counts and known values may be used to calculate a scaling factor for the converter corresponding using the formula: Scaling factor=initial scaling factor*abs((first known value–second known value)/(first calibration count–second calibration count)). Using the determined scaling factor then an offset can be determined using one of the known values (for example the known value in the desired scale) expressed in the desired scale using the formula: Offset=((scaling factor divided by the initial scaling factor)*first calibration count) plus first known value (in the desired scale).

With reference now to back to FIG. 4, once the scaling factor is determined (and optionally any offset) the converter may be operated in the count-to-time mode at step 330 and the time-to-count mode at step 340 to obtain a desired output corresponding to a level on an input signal. FIG. 12 depicts one embodiment of operating a converter in a count-to-time mode using a determined scaling factor. Here a count of the time taken for a count of the output of the converter to reach the determined scaling factor using a reference signal as input to the converter may be determined. For example, with respect to converter 800, a previously determined scaling factor (M) may be used and reference signal 880 selected as input to the converter 800. At steps 912 and 922 then, counter 840 and timer 830 may be cleared. Counter 840 and timer 830 are then enabled at step 932. The count (N) in counter 840 is then incremented as a function of the output 805 of variable oscillator 810. After each increment of counter 840 it can then be determined if the value in counter 840 is equal to the scaling factor (M) at step 942. If so, then counter 840 and timer 830 are disabled at step 952. The resulting value TM in timer 830 represents the time to reach the scaling factor when using the reference signal as input.

As was noted earlier the functionality of various portions of a converter or hardware or software utilized in conjunction with certain embodiments may vary. For example, by utilizing up/down counters or adders or subtractors, two's complement arithmetic, decimators in conjunction with counter 840 and timer 830. In such a case, operating converter at 800 may comprise, for example, setting counter 840 to the negative value of the scaling factor (–M) clearing timer 830 at steps 916 and 926. Counter 840 and timer 830 are then enabled at step 936. The count (N) in counter 840 is then incremented as a function of the output 805 of variable oscillator 810. After each increment of counter 840 it can then be determined if the value in counter 840 is equal to zero at step 946. If so, then counter 840 and timer 830 are disabled at step 956.

In either case the resulting clock count (K) may then be used during operation of the converter in the time-to-count mode to obtain a desired output corresponding to the input signal. FIG. 13 depicts one embodiment a method for operating a converter in the time-to-count mode. Here, an output corresponding to the level on the input signal may be determined by counting the output of the converter during a time period corresponding to the clock count (K) using the input signal. Specifically, with respect to converter 800, input signal 801 may be selected as input to converter 800 and at steps 914 and 924 counter 840 and timer 830 may be cleared. At step 934 then, counter 840 and timer 830 may be enabled. The count (N) value in counter 840 is then incremented as a function of the output 805 of variable oscillator 810. After each increment of the value (T) of timer 830 it can be determined if the value in timer 830 is equal to the clock count (K) resulting from the count-to-time operation (discussed in FIG. 12). If so, counter 840 and timer 830 may be disabled at step 954. The count N in counter 840 then corresponds to a measurement associated with the value of input signal 801. This count can then be adjusted at step 964 by subtracting the offset (B) from the count to yield an output which represents a measurement in a desired scale.

Again, the functionality of various portions of a converter or hardware or software utilized in conjunction with certain embodiments may vary. For example, in certain cases operating converter at 800 may comprise, for example, setting counter 840 to the negative value of the offset (−B) at step 917 and at step 927 setting timer 830 to the negative value of the clock count (−K). At step 937 then, counter 840 and timer 830 may be enabled. The count (N) value in counter 840 is then incremented as a function of the output 805 of variable oscillator 810. After each increment of the value (T) of timer 830 it can be determined if the value in timer 830 is equal to 0. If so, counter 840 and timer 830 may be disabled at step 957. The count N in counter 840 then corresponds to a measurement associated with the value of input signal 801 adjusted by the offset (B).

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

It will be appreciated that all such modifications are encompassed herein. For example, a reference signal does not have to be a different signal from the input signal, but could be the input signal itself. Suppose, for instance, it was desired to only measure changes in an input, ignoring a background or average signal level. An example might be a motion detector. From the dual-mode operation, a value X is loaded into a counter (for example, such as counter 440 or counter 840) and then the converter operated in count-to-time mode. If the result is then used in a time-to-count mode without changing the input signal (for example, via multiplexer 402 or 802) then the result Y will be equal to X. Now assume that some sort of long term averaging is done on the result of the count-to-time mode X, (for example a exponential moving average) then the output Y from time-to-count a measure of a short term change can be determined. In, for example, the case of a motion detector, the slowly changing background signal (light, heat, capacitance, noise, etc.) will be filtered out and the sensor will then respond to changes that are rapid relative to the background change rate. As can be realized this may be important in a variety of contexts or settings.

Additionally, in one embodiment, the reference signal is not static, (light flashes, response to another transitory stimulus, etc.). In this case the converter can measure relative changes between the "reference" and the "input" signal which, as described above, can be one and the same. Converters such as those described in FIG. 9 may be particularly amenable to this mode of operation.

Furthermore, count to time scaling outputs may not be dynamically generated. The count-to-time scaling outputs could be, for example, predetermined (for example, during a calibration or manufacturing process) and stored in a lookup table for comparison to realtime time to count measurements.

Moreover, count-to-time and time-to-count could be reversed. For example in the case where the reference and the input signal are the same the result can be thought of as Q/average(Q). By reversing the sense of count-to-time and time-to-count the result would be average(Q)/Q.

Thus, it will be understood that benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A converter, comprising:
a converter configured to operate using an input signal for a number of cycles of a clock to determine an output count, wherein the number of cycles is substantially equal to a clock count and the clock count was determined during a calibration process using a desired scaling factor.

2. The converter of claim 1, wherein the clock count is stored in a memory.

3. The converter of claim 1, wherein the converter includes a switched capacitor converter.

4. The converter of claim 1, wherein the converter includes a continuous time converter.

5. The converter of claim 2, wherein the calibration process was performed utilizing another converter.

6. The converter of claim 5, wherein the clock count was stored in the memory during a manufacturing process.

7. The converter of claim 1, further comprising determining an output signal based on the output count, wherein the output signal is based on a scaling factor.

8. A circuit, comprising:
a converter coupled to an input signal;
a clock; and
a controller for:
operating the converter using the input signal for a number of cycles of the clock to determine an output count, wherein the number of cycles is substantially equal to a clock count and the clock count was determined during a calibration process.

9. The circuit of claim 8, further comprising a memory, wherein the clock count is stored in the memory.

10. The circuit of claim 8, wherein the converter is a switched capacitor converter.

11. The circuit of claim 8, wherein the converter is a continuous time converter.

12. The circuit of claim 9, wherein the calibration process was performed utilizing another circuit.

13. The circuit of claim 12, wherein the clock count was stored in the memory during a manufacturing process.

14. The circuit of claim 8, further comprising determining an output signal based on the output count, wherein the output signal is based on the scaling factor.

15. A method, comprising:
   operating a converter using an input signal for a number of cycles of a clock to determine an output count, wherein the number of cycles is substantially equal to a clock count and the clock count was determined during a calibration process; and
   determining an output signal based on the output count.

16. The method of claim 15, wherein the clock count is stored in a memory.

17. The method of claim 15, wherein the converter includes a switched capacitor converter.

18. The method of claim 15, wherein the converter includes a continuous time converter.

19. The method of claim 16, wherein the calibration process was performed utilizing another converter.

20. The method of claim 19, wherein the clock count was stored in the memory during a manufacturing process.

21. The method of claim 15, wherein the output signal is based on a scaling factor.

* * * * *